United States Patent [19]
Kaneko et al.

[11] Patent Number: 5,814,239
[45] Date of Patent: Sep. 29, 1998

[54] GAS-PHASE ETCHING AND REGROWTH METHOD FOR GROUP III-NITRIDE CRYSTALS

[75] Inventors: Yawara Kaneko, Fuchu; Norihide Yamada, Kokubunji, both of Japan

[73] Assignee: Hewlett-Packard Company, Palo Alto, Calif.

[21] Appl. No.: 684,608

[22] Filed: Jul. 19, 1996

[30] Foreign Application Priority Data

Jul. 29, 1995 [JP] Japan ................................. 7-212374

[51] Int. Cl.$^6$ ....................................... B44C 1/22
[52] U.S. Cl. .................. 216/63; 216/37; 216/74; 216/77; 438/694; 438/715; 438/717
[58] Field of Search ................ 216/37, 63, 74, 216/77; 438/694, 715, 717

[56] References Cited

U.S. PATENT DOCUMENTS

| | | | |
|---|---|---|---|
| 5,270,263 | 12/1993 | Kim et al. | 438/717 |
| 5,535,905 | 7/1996 | Harris et al. | 216/37 |
| 5,567,659 | 10/1996 | Pakulski et al. | 438/694 |

FOREIGN PATENT DOCUMENTS

| | | |
|---|---|---|
| 61-056474 | 3/1986 | Japan . |
| 63-211618 | 9/1988 | Japan . |
| 04146619 | 5/1992 | Japan . |
| 2271466 | 4/1994 | United Kingdom . |

OTHER PUBLICATIONS

J.I. Pankove, "Electrolytic Etching of GaN", J. Electrochem. Soc. Solid–State Science and Technology, Aug. 1972, vol. 119, No. 8, pp. 1118–1119.

S.J. Pearton et al., "Low Bias Electron Cyclotron Resonance Plasma Etching of GaN, AlN, and InN", Appl. Phys. Lett. vol. 64, No. 17, Apr. 25, 1994, pp. 2294–2296.

Masaki Nagahara et al., "Selective Growth of Cubic GaN in Small Areas on Patterned GaAs(100) Substrate by Metalorganic Vapor Phase Epitaxy", Jpn. J. Appl. Phys. vol. 33, (1994), pp. 694–697.

H. Tsuchiya et al., "Homoepitaxial Growth of Cubic GaN by Hydride Vapor Phase Epitaxy on Cubic GaN/GaAs Substrates Prepared with GaAs Source Molecular Beam Epitaxy", Jpn. J. Appl. Phys., vol. 33, (1994) pp. 1747–1752.

K. Fuji et al., "Model for In–Situ Etching and Selective Epitaxy of $AL_xGa_{1-x}As$ with HCL Gas by Metalorganic Vapor Phase Epitaxy", J. Crystal Growth. vol. 145, (1994), pp. 277–282.

R.T. Leonard et al., Photoassisted Dry Etching of GaN, Appl Phys. Lett., vol. 68, Feb. 5, 1996, pp. 794–796.

*Primary Examiner*—Roland Martin
*Attorney, Agent, or Firm*—Ian Hardcastle

[57] ABSTRACT

A gas-phase etchant is provided. The gas-phase etchant includes at least one halogen in gaseous form and/or at least one halogen halide in gaseous form. A Group III-nitride crystal is heated to a temperature in the range of 500°–900° C. and is etched in a flow of the gas-phase etchant. The gas-phase etchant may additionally include hydrogen. The gas-phase etchant may alternatively be diluted with inert gas, and the Group III-nitride crystal may be etched in a flow of the gas-phase etchant diluted with the inert gas.

17 Claims, 4 Drawing Sheets

5,814,239

GAS-PHASE ETCHING AND REGROWTH METHOD FOR GROUP III-NITRIDE CRYSTALS

FIELD OF THE INVENTION

The invention relates to a method for gas-phase etching Group III-nitride crystals to produce an etched surface having an excellent surface quality. The invention also relates to a regrowth method that is performed after the gas-phase etching. In particular, the invention relates to a method of gas-phase etching and regrowth for Group III-nitride crystals. The method can be used to fabricate diodes or semiconductor lasers that emit ultraviolet to green light, light detectors, transistors for use at high temperatures, and semiconductor elements. Additionally, the methods according to the invention are well suited for use in mass production, are low in cost and result in high yields.

BACKGROUND OF THE INVENTION

Compared to AlGaAs crystals and other typical III-V crystals such as AlGaInP or GaInAsP, Group III-nitride crystals such as GaN are extremely difficult to etch. A variety of etching methods have been proposed. These methods are broadly classified into wet etching and dry etching. For example, wet etching places the surface of the GaN crystal to be etched in contact with a wet etchant, such as sodium hydroxide solution.

In one example of dry etching, the surface of the GaN crystal to be etched is irradiated with a plasma of ions, for example, Ar ions.

Recently, a report in 64 APPL. PHYS. LETT. (17), 25 Apr. 1994, entitled *Low Bias Electron Cyclotron Resonance Plasma Etching of GaN, AlN, and InN*, proposed that $Cl_2/H_2$ or $CH_4/H_2/Ar$ plasma irradiation be used to etch the surface of Group III-nitride crystals such as GaN, AlN, and InN. This technique can also be classified as dry etching.

Wet etching has a slow etch rate, even when a high-temperature etchant is used, and produces a rough etched surface. This makes it difficult to regrow a high-quality crystal on the etched surface using, for example, metal-organic chemical vapor deposition (MOCVD) or hydride vapor phase epitaxy (HVPE). Thus, additional processing is necessary to improve the flatness of the etched surface before MOCVD or HVPE can be performed.

On the other hand, dry etching uses a mechanical etchant instead of a chemical etchant, and has a fast etch rate. However, dry etching not only results in a rough etched surface, but also tends to damage the structure of the crystal. This leads to a concern that devices made from a crystal whose structure has been damaged by dry etching will have degraded operating characteristics and a shortened lifetime.

Therefore, a new method for etching Group III-nitride crystals is required. The method should have a rapid etch rate, produce a smooth etched surface and should not damage the structure of the crystal.

SUMMARY OF THE INVENTION

Thus, the invention provides a method for gas-phase etching Group III-nitride crystals. The method does not use plasma irradiation in contrast to the conventional dry etching technologies described above. Moreover, the present invention provides a method for gas-phase etching Group III-nitride crystals that does not damage the crystal structure, and that produces an etched surface with excellent surface quality and on which high-quality regrowth is possible. The method according to the invention can be used in fabricating light-emitting diodes or semiconductor lasers that emit ultraviolet to green light, light detectors, transistors for use at high temperatures, and other semiconductor elements. The method is well suited for use in mass production, has low cost and results in a high yield.

The present invention also provides a method in which regrowth is performed on the etched surface immediately after the etching operation and results in high performance elements.

In the gas-phase etching method according to the present invention, a gas-phase etchant is provided. The gas-phase etchant includes at least one halogen in gaseous form and/or at least one hydrogen halide in gaseous form. A Group III-nitride crystal is heated to a temperature in the range of 500°–900° C. and is etched in a flow of the gas-phase etchant. The gas-phase etchant may additionally include hydrogen. The gas-phase etchant may alternatively be diluted with inert gas, and the Group III-nitride crystal may be etched in a flow of the gas-phase etchant diluted with the inert gas.

In the regrowth method of the present invention, regrowth is immediately performed on the etched surface provided by the gas-phase etching method of the present invention. Since the gas-phase etching method according to the invention is compatible with the type of reactor used to perform MOCVD or HVPE, the regrowth can be performed in the same reactor as that in which the gas-phase etching was performed. Performing the etching and the regrowth in the same reactor saves having to transfer the newly-etched crystal to another reactor to perform the regrowth, and reduces the risk of contamination of the etched surface prior to the regrowth being performed.

The gas-phase etching and regrowth method according to the present invention can be applied to such Group III-nitride crystals as GaN, AlN, InN, GaInN, AlInN, AlGaN, AlGaInN, or BAlGaInN. The benefits of the invention set forth above are easily obtained using these Group III-nitrides.

The gas-phase etchant may be composed of at least one of the halogens, i.e., $F_2$, $Cl_2$, $Br_2$, and $I_2$, in gaseous form, and/or at least one of the hydrogen halides, i.e., HF, HCl, HBr, and HI, in gaseous form, with or without hydrogen.

The inert gas used for diluting the gas-phase etchant can be $N_2$, He, or Ar.

DETAILED DESCRIPTION OF THE INVENTION

Figure 1:
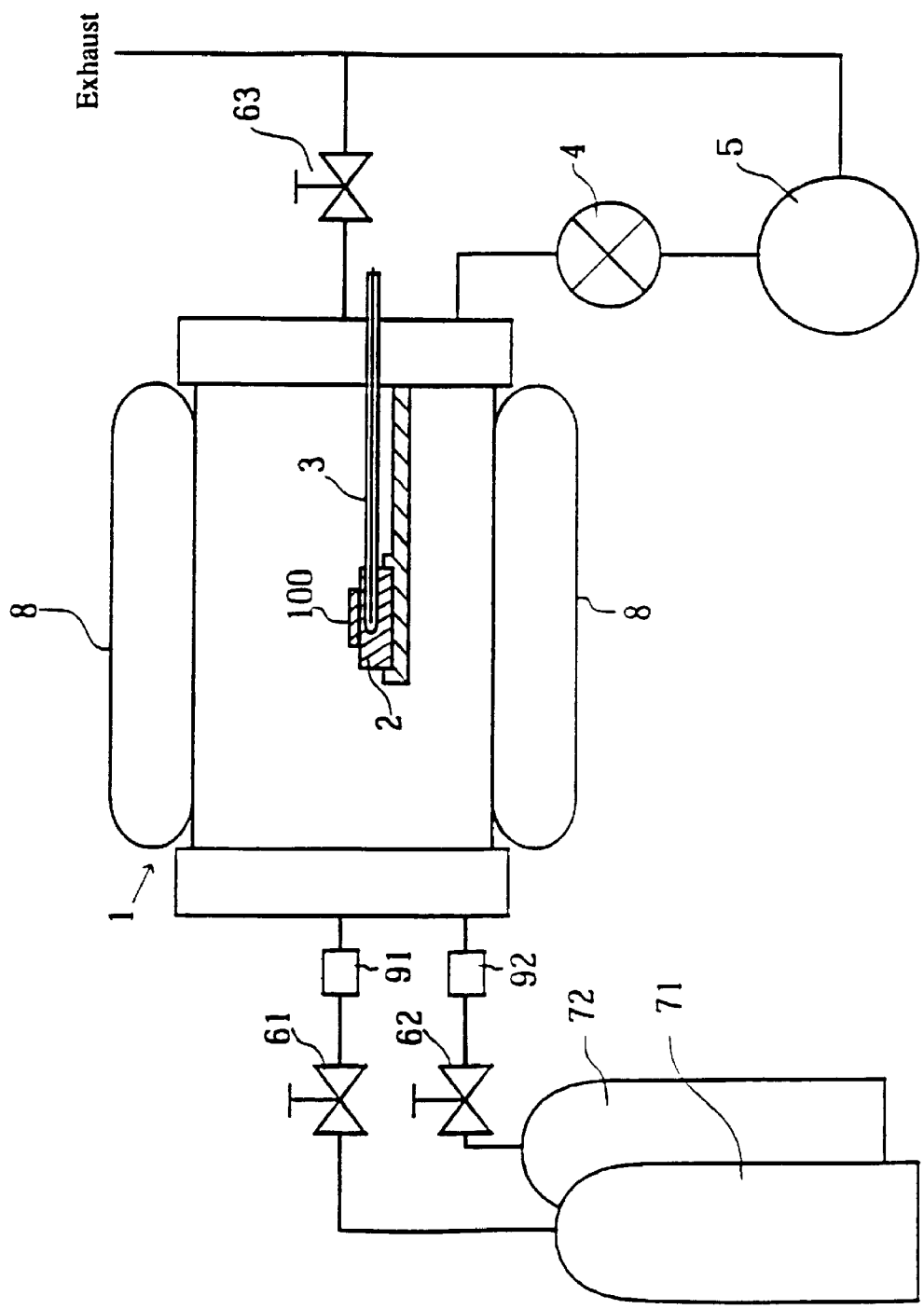
FIG. 1 is a schematic view of an example of a reactor that can be used to perform the gas-phase etching method according to the present invention.

The gas-phase etching method according to the invention for Group III-nitride crystals provides an excellent etched surface quality by etching the Group III-nitride crystal under specific high temperature conditions in flow of a specific gas-phase etchant that includes specific components. No plasma irradiation is used in the gas-phase etching method according to the invention. The gas-phase etching method according to the invention can be easily be performed using the same type of reactor as is used for performing MOCVD or HVPE. This enables regrowth to be performed using MOCVD or HVPE immediately after the etched surface has been formed without having to transfer the Group III-nitride crystal to another reactor. Using the same reactor prevents an oxide film or a carbon film, which would obstruct regrowth, from being formed on the etched surface, and prevents contamination of the regrowth interface with impurities.

In the gas-phase etching method according to the present invention, a gas-phase etchant is provided. The gas-phase etchant includes at least one halogen in gaseous form and/or at least one hydrogen halide in gaseous form. A Group III-nitride crystal is heated to a temperature in the range of 500°–900° C. and is etched in a flow of the gas-phase etchant. The gas-phase etchant may additionally include hydrogen. The gas-phase etchant may alternatively be diluted with inert gas, and the Group III-nitride crystal may be etched in a flow of the gas-phase etchant diluted with the inert gas.

The regrowth method of the present invention enables regrowth to be immediately performed on the etched surface provided by the gas-phase etching method of the present invention.

The gas-phase etchant may be composed of at least one of the halogens, i.e., $F_2$, $Cl_2$, $Br_2$, and $I_2$, in gaseous form, and/or at least of the hydrogen halides, i.e., HF, HCl, HBr, and HI, in gaseous form, with, or without, hydrogen.

The inert gas used for diluting the gas-phase etchant can be $N_2$, He, or Ar.

When the gas-phase etchant includes hydrogen and at least one halogen in gaseous form and/or at least one hydrogen halide in gaseous form, the gas-phase etchant etches the Group-III nitride crystal using the reactions described by the formulas (a) and/or (b) shown below. The preferred mixture ratios of the constituents of the gas-phase etchant are those which provide the quantities of halogen and hydrogen that are needed in the reactions described by formulas (a) and (b). In formulas (a) and (b), GaN is used as an example of the Group III-nitride.

$$GaN + 3X + 3/2 H_2 \rightarrow GaX_3 + NH_3 \quad (a)$$

$$GaN + 3HX \rightarrow GaX_3 + NH_3 \quad (b)$$

where X denotes a halogen.

The ammonia ($NH_3$) generated in the reactions described by the formulas (a) and (b) further reacts with the halogen and the hydrogen or the hydrogen halide of the gas-phase etchant to generate ammonium halide ($NH_4X$). Therefore, is is preferable that the mixture ratio be determined to take account of the additional quantities of halogen, hydrogen, and/or hydrogen halide consumed by this additional reaction.

In the present invention, when the gas-phase etchant includes hydrogen and at least one halogen in gaseous form and/or at least one hydrogen halide in gaseous form, the fraction of the at least one halogen in gaseous form and/or at least one hydrogen halide in gaseous form in the gas-phase etchant is between 0.001 vol % and 100 vol %, and is preferably between 0.1 vol % and 10 vol %.

The constituent gases of the gas-phase etchant may be mixed prior to supplying the gas-phase etchant to the reactor in which etching is carried out. Alternatively, the constituent gases may be supplied to the reactor separately and mixing to form the gas-phase etchant may occur in the reactor.

The flow rate of the gas-phase etchant supplied to the reactor should be that which causes the above-mentioned etching reaction to proceed at such a rate that the $GaX_3$ or $NH_3$ by-products generated by the reaction can easily be exhausted from the reactor. The rate at which the reaction by-products are exhausted from the reactor is related to the characteristics of the equipment used (for example, the size of the reaction pipe and/or the performance of the exhaust system), the size of the Group III-nitride crystal being etched, and the amount of etching. However, a flow rate in the range of about 0.1 milliliters per second (ml/s) to 10 liters per second (l/s) is preferred for the gas-phase etchant when a reaction pipe diameter of 80 mm is used in the present invention.

The Group III-nitride crystal can be etched using the reaction described in formula (b) set forth above. However, the present invention is not limited to a gas-phase etchant that includes hydrogen, as described above. The gas-phase etchant can include at least one halogen in gaseous form, in which case, the etching process is described by formula (c):

$$GaN + 3X \rightarrow GaX_3 + N_2 \quad (c)$$

When at least one halogen in gaseous form is used as the gasous etchant, the flow rate of the gas-phase etchant is similar to the flow rate of the gas-phase etchant including hydrogen described above. When the reaction pipe diameter is 80 mm, a flow rate in the range of 0.1 ml/s to 10 l/s is preferred.

Furthermore, in the present invention, the gas-phase etchant can be diluted by an inert gas. The fraction of the gas-phase etchant in the gas-phase etchant diluted with inert gas is between 0.001 vol % and 100 vol %, and is preferably between 0.1 vol % and 20 vol %.

When any of the gas-phase etchants described above, and irrespective of whether the gas-phase etchant is diluted with inert gas, best etching results are obtained with the temperature of the Group III-nitride crystal in the range of 500° to 950° C. A temperature less than 500° C. results in too slow an etch rate to be practical. A temperature above 950° C. results in too fast an etch rate, increases the possibility that the surface quality of the etched surface will be impaired, and degrades the flatness of the etched surface.

The gas-phase etchants described above, irrespective of whether they are diluted with inert gas, are preferably used at atmospheric pressure, but excellent etching of Group III-nitride crystals can still be obtained at lower or higher pressures. However, because of the equipment structure and operational convenience, performing the etch at atmospheric pressure provides advantages in terms of manufacturing cost.

The regrowth method according to the present invention should be performed immediately after a surface of the Group III-Nitride crystal has been etched using the gas-phase etching method according to the present invention described above. In other words, as will be described below, the basic structure of the reactor used for performing the gas-phase etching method according to the present invention is the same as that of the reactor used to perform conventional regrowth methods such as MOCVD or HVPE.

Consequently, after the gas-phase etching according to the present invention has been completed, the Group III-nitride crystal with the etched surface is not removed from the reactor in which the gas-phase etching was performed, but is then immediately subject to the regrowth method according to the present invention.

When the regrowth method according to the present invention is used, etching and regrowth can be performed in the same reactor. In other words, the regrowth method is performed on the Group III-nitride crystal after it has been etched without removing the crystal from the reactor and without allowing the etched surface to come into contact with the atmosphere. This prevents such problems as the growth of an oxide film or a carbon film on the etched surface, which obstructs regrowth, or the introduction of impurities at the regrowth interface.

The reactor shown in FIG. 1, for example, can be used to perform the gas-phase etching and regrowth method according to the present invention using any of the gas-phase etchants described above. The gas-phase etching and regrowth method according to the invention is performed according to the following procedure. Two gas cylinders 71 and 72, inert gas cylinders (not shown), and a supply source (not shown) of each type of material needed during regrowth are set up. Gas from the gas cylinders 71 and 72, and the inert gas cylinders are mixed in the specified ratios and are diluted, if necessary, immediately before being introduced to the reactor 1.

The procedure used when the gas-phase etchant includes hydrogen, as described above, will now be described. The gas cylinder 71 contains at least one halogen in gaseous form and/or at least one hydrogen halide in gaseous form. The gas cylinder 72 contains hydrogen. Since halogens and hydrogen halides are corrosive, the gas in the gas cylinder 71 may be diluted with hydrogen or a suitable inert gas.

The Group III-nitride crystal 100 grown on a substrate such as sapphire is loaded on the susceptor 2 provided in the reactor 1. In the following description, a GaN crystal will be used as an example of the Group III-nitride crystal 100. However, the method according to the invention can applied to any Group III-nitride crystal. The thermocouple 3 is set to measure the temperature of the crystal 100 on the susceptor 2.

Prior to etching, the GaN crystal 100 is masked by suitable masking material to define the parts of the crystal that will be etched. For example, $SiO_2$ or a two-layer film of Au (top layer) and Ti (bottom layer) may be used as the masking material.

The valve 4 is opened, and the vacuum pump 5 is operated to exhaust the interior of the reactor 1. The valve 4 is then closed, and the valve 61 and/or the valve 62 are opened to supply the gas in the gas cylinders 71 and/or 72 to the interior of the reactor. This purges the interior of the reactor.

The pressure in the reactor 1 during the purge operation and the subsequent etching operation is set to atmospheric pressure by keeping the valves 61, 62 and 63 open, and using the mass flow controllers 91 and 92 to adjust the flow rates of the gases constituting the gas-phase etchant so that a steady flow of the gas-phase etchant is provided at substantially atmospheric pressure.

With the gases constituting the gas-phase etchant flowing as just described, the interior of the reactor 1 is heated by the heat source 8 placed in or near the reactor. As the GaN crystal 100 is heated, its temperature is measured by the thermocouple 3. Heating continues until the GaN crystal reaches a specified temperature within the range of 500° to 950° C. When the temperature of the GaN crystal is within this range, the gases constituting the gas-phase etchant etch the GaN crystal according to the reactions defined by the formulas (a) and/or (b) set forth above. The GaN crystal is etched where its surface is not masked and contacts the gas-phase etchant.

The $NH_3$ generated by the etching reaction reacts again with the gas-phase etchant in the reactor 1 to form $NH_4X$. The $NH_4X$, any $NH_3$ that did not react with the gas-phase etchant, the $GaX_3$ and any other volatile compounds created by the etching reaction are discharged to the outside through valve 63 along with excess gas-phase etchant (primarily, hydrogen) not consumed by the etching reaction.

The etching reaction just described continues until the required etching depth has been reached. The flow of the gas-phase etchant is then discontinued.

Since the reactor 1 has the same basic structure as the reactor used for performing MOCVD or HVPE, when MOCVD or HVPE is performed to perform the regrowth method according to the present invention on the etched surface as described above, the GaN crystal 100 can remain loaded on the susceptor 2 at the end of the etching process. The GaN crystal 100 can then undergo regrowth by MOCVD or HVPE without being removed from the reactor 1. The MOCVD or HVPE process used to perform the regrowth on the etched surface is conventional and so will not be described here.

The procedure for etching the GaN crystal 100 using the gas-phase etchant including at least one halogen in gaseous form and/or at least one hydrogen halide in gaseous form will be described next. Since this procedure is almost identical to that using the gas-phase etchant including at least one halogen in gaseous form and/or at least one hydrogen halide in gaseous form and additionally including hydrogen, only the parts of the procedure that are different will be described.

To simplify the following explanation, the gas cylinder 71 will be regarded as being the gas cylinder that contains the at least one halogen in gaseous form and/or at least one hydrogen halide in gaseous form.

The at least one halogen in gaseous form and/or at least one hydrogen halide in gaseous form is introduced into the reactor 1 from the gas cylinder 71 by opening the valves 61 and 63. The at least one halogen in gaseous form and/or at least one hydrogen halide in gaseous form constituting the gas-phase etchant etch the GaN crystal according to the reactions defined by the formulas (b) and/or (c) set forth above, depending on the gas-phase etchant used. The GaN crystal is etched where its surface is not masked and contacts the gas-phase etchant.

The $NH_3$ created by the etching reaction further reacts with the gas-phase etchant in the reactor 1 and becomes ammonium halide $NH_4X$. The $NH_4X$, $NH_3$, $GaX_3$, $N_2$, and other products of the reaction are discharged outside the reactor through the valve 63, together with the excess gas-phase etchant that was not consumed by the etching reaction.

The etching reaction just described continues until the required etching depth has been reached. The flow of the gas-phase etchant is then discontinued.

The regrowth method according to the present invention can be performed on the newly-etched surface of the GaN crystal 100 by MOCVD or HVPE after the above-described etching method has been performed. Similar to when the gas-phase etchant additionally includes hydrogen, the regrowth can be performed without removing the GaN crystal 100 from the susceptor 2 inside the reactor 1.

Next, the procedure used when the gas-phase etchant is diluted with inert gas will be described. Since this procedure is almost identical to using the undiluted gas-phase etchant described above, only the parts that differ will be described.

In this procedure, an additional gas cylinder (not shown) filled with the inert gas to be used for diluting the gas-phase etchant is provided in addition to the gas cylinders 71 and 72. Alternatively, the gas cylinders 71 and 72 can be filled with the respective gases diluted with inert gas.

The GaN crystal 100 is etched by adjusting the relative rates of flow of gas from the cylinders 71 and 72 and the additional gas cylinder to establish the specified mixture ratio and dilution ratio of the gas-phase etchant immediately before introduction into the reactor 1. The resulting gas-phase etchant diluted with the inert gas is introduced the gas into the reactor 1 in the quantity specified described above, and etching takes place by the etching reaction described in the appropriate one of formulas (a) to (c) described above.

When the etching process is complete, the GaN crystal 100 may remain on the susceptor 2 so that regrowth by MOCVD, HVPE or some other suitable regrowth process can be performed.

Three specific examples of the gas-phase etching method according to the invention will now be described.

EXAMPLE 1

Sample Preparation

In the following description of the first example, a GaN crystal will be used as an example of a Group III-nitride crystal. The GaN crystal is prepared for etching by depositing a patterned two-layer mask structure of Au (top layer) /Ti (bottom layer) on the surface to be etched, as shown in the cross-sectional view of FIG. 2. Apertures in the two-layer mask structure define the parts of the surface that will be etched by the gas-phase etching method.

Figure 2:
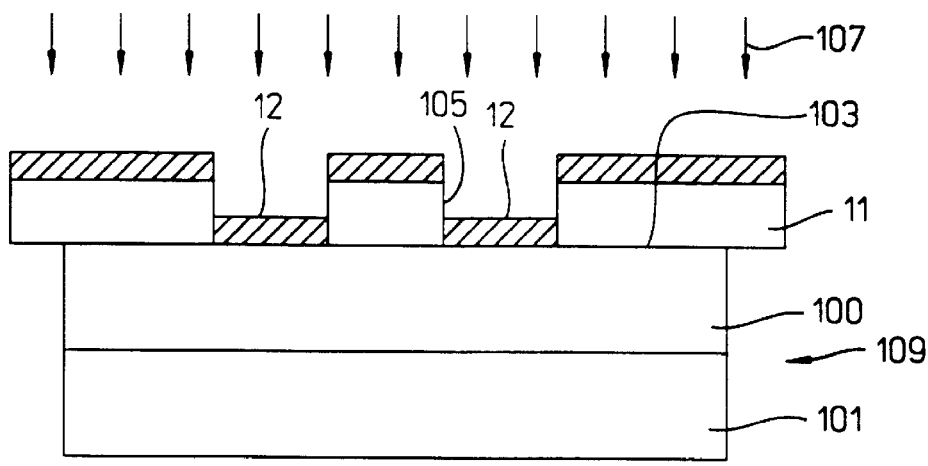
FIG. 2 shows how an etch mask is applied to the sample prior to etching using the gas-phase etching method according to the present invention.

FIG. 2 shows the stainless-steel mask 11 placed in contact with the surface 103 of the GaN crystal sample 109 composed of the GaN crystal 100 grown on the sapphire substrate 101. Apertures, such as the aperture 105, in the stainless-steel mask define the areas of the surface 103 on which the two-layer mask structure will be formed. First, Ti is sputtered to the desired thickness in the direction of the arrows 107. Then, the layer of Ti is covered with a layer of Au sputtered to the desired thickness. The stainless-steel mask 11 is then removed from the surface 103. This leaves parts of the surface 103 protected from etching by the two-layer mask structure 12.

Figure 3:
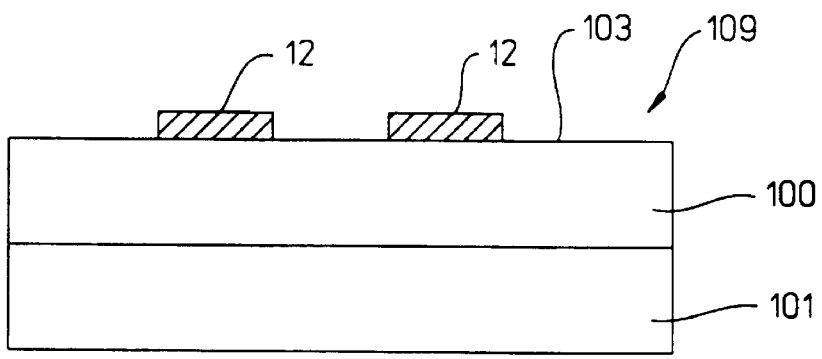
FIG. 3 shows the sample prepared by the masking method shown in FIG. 2.

FIG. 3 shows the GaN crystal sample 109 just prior to etching. The two-layer mask structure 12 deposited on the parts of the surface 103 of the GaN crystal 100 that were exposed by the apertures in the stainless-steel mask 11 protects these parts of the surface during the following gas-phase etching process.

Etching

The GaN crystal sample 109 having parts of its surface 103 protected by the two-layer mask structure 12, as just described, is etched by executing the procedure described above using the reactor 1 shown in FIG. 1.

The GaN crystal sample 109 shown in FIG. 3 was set in the state shown in FIG. 1 in the reactor 1. The thermocouple 3 was set to measure the temperature of the sample 109.

Next, as described above, the vacuum pump 5 was operated to decrease the pressure inside the reactor 1. The valve 61 was then opened to introduce hydrogen from the gas cylinder 71 into the interior of the reactor 1. This purged the interior of the reactor 1 with hydrogen. The gas flow was continued until the pressure inside the reactor reached about atmospheric pressure.

Next, while maintaining the flow of hydrogen from the gas cylinder 71, the valves 62 and 63 were opened, and the mass flow controller 91 was adjusted to provide a flow rate of about 1 P/minute of hydrogen from the gas cylinder 71 into the reactor 1. Before the hydrogen enters into the reactor 1 from the gas cylinder 71, it is mixed with a flow from the gas cylinder 72 of about 100 ml/minute of hydrogen chloride gas diluted to 5 vol % with hydrogen gas. The flow rate of the dilute hydrogen chloride gas is set by adjusting the mass flow controller 92.

The heat source 8 was then operated to heat the GaN crystal sample 109 to a temperature of 640° C. Heating the sample continued until the thermocouple 3 indicated 640° C. The flow of the gaseous etchant over the sample 109 was continued for one hour after the temperature of the sample reached 640° C. to etch the exposed surface of the sample.

Figure 4:
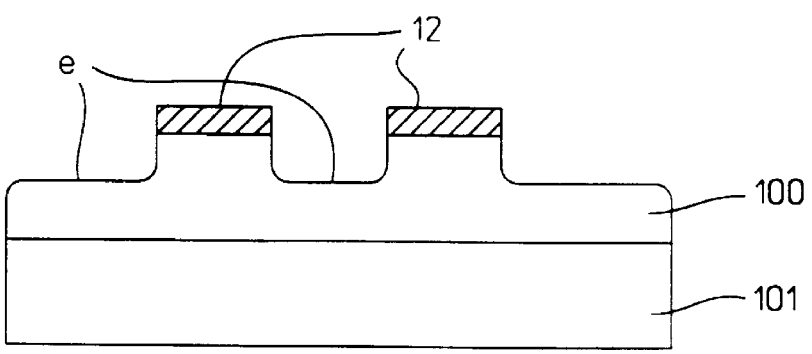
FIG. 4 shows the sample illustrated in FIG. 3 after it has been etched using the gas-phase etching method according to the present invention.
Figure 5A:
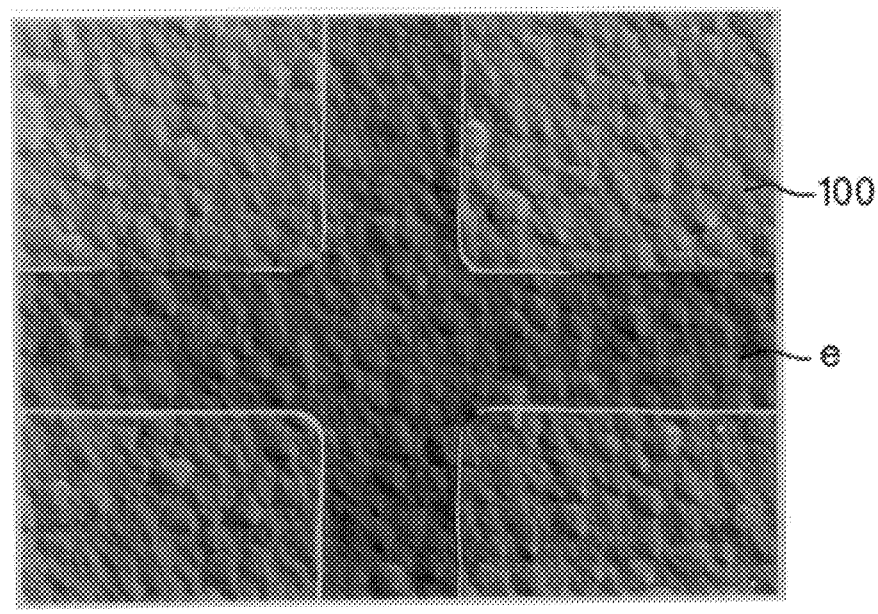
FIG. 5A is a copy from a video printer (150× magnification) of the etched surface obtained using the gas-phase etching method according to the present invention.

FIG. 4 shows the GaN sample 109 at the end of the etching method according to the invention. The state of the etched surface of a typical sample after etching is shown in FIG. 5(A), which is a copy from a video printer (150× magnification). In FIGS. 4 and 5(A), e indicates the etched surface. The depth of the etched surface was 0.17 μm in this example.

The area indicated by 100 in FIG. 5(A) is the part of the surface 103 of the GaN crystal sample 109 protected by the two-layer masking structure 12 shown in FIG. 4, i.e., the part of the surface of the GaN crystal sample that is not etched.

Figure 5B:
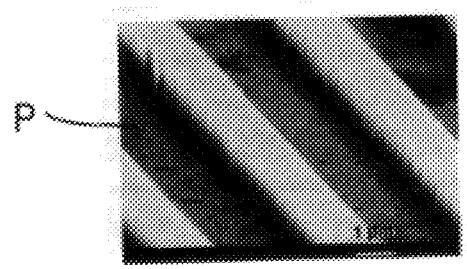
FIG. 5B is a copy of a photomicrograph of the etched surface obtained using a conventional etching method.

For comparison, FIG. 5(B) shows a photomicrograph of the etched surface resulting from a conventional dry-etch process in which 1,000 W microwaves were used, and a GaN crystal sample was plasma etched by $Cl_2/H_2$ gas (1 mTorr, −150 VDC). This photomicrograph was published in *Low Bias Electron Cyclotron Resonance Plasma Etching of GaN, AlN, and InN,* 64 APPL. PHYS. LETT. (17), 25 Apr. 1994.

FIG. 5(B) shows an etched surface that is fairly rough and is pitted by the holes p. In contrast, the etched surface produced by the gas-phase etching method according to the invention and shown in FIG. 5(A) is smooth and unpitted.

EXAMPLE 2

Sample Preparation

In the second example, the Group III-Nitride crystal sample that was etched was a structure in which crystals of GaN/GaInN/AlGaN were successively grown on a sapphire substrate. The masking material was a layer of $SiO_2$. Apertures were formed in the $SiO_2$ masking layer to define the parts of the surface of the crystal sample to be etched in a way similar to the apertured two-layer making structure described above.

Etching

Except for a temperature of 690° C. and an etching time of one hour, the sample 109 was etched in the same way as that described above with reference to example 1.

Performing MOCVD Regrowth on the Etched Surface

After the end of the gas-phase etching process, MOCVD was carried out on the sample 109 without removing the sample from the reactor 1. An additional GaN crystal structure was regrown on the etched surface by MOCVD to form a buried growth. It is predicted that the service life of the buried laser structure resulting from the regrowth will be significantly longer than a similar structure made using conventional plasma etching because the gas-phase etching process according to the invention does not damage the crystal structure.

EXAMPLE 3

Figure 6:
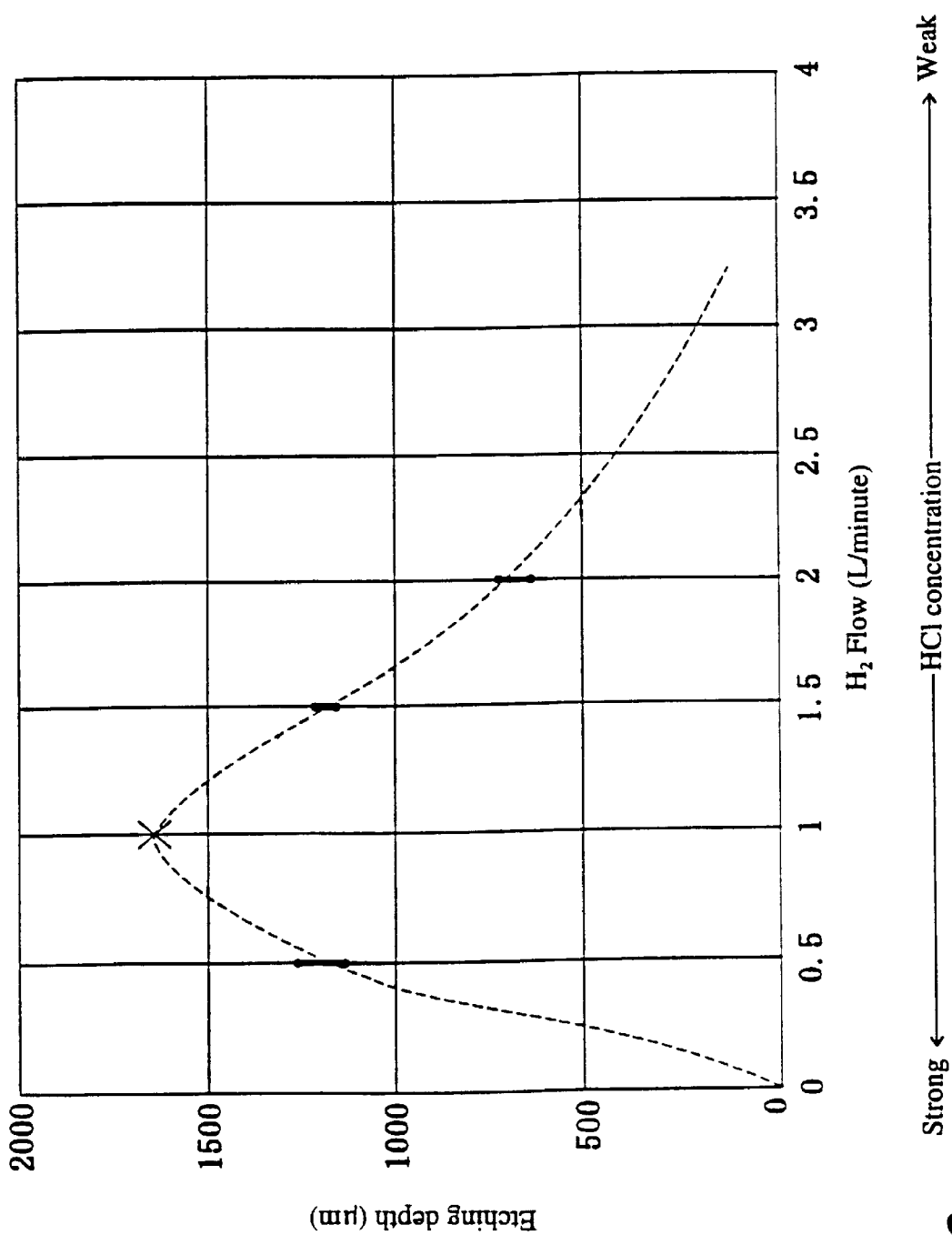
FIG. 6 shows how the etching depth measured after one hour varies with the concentration of the HCl gas in the gas-phase etchant at a given temperature.

Except for a number of changes in the hydrogen flow rate, the GaN crystal sample 109 was etched under the same conditions as described above with reference to example 1. The etching depth produced after one hour was measured to measure an etch rate. FIG. 6 shows how the measured rate varies with the concentration of the HCl gas in the gas-phase etchant at a given temperature. The concentration of the HCl gas was varied by keeping the flow rate of the HCl gas fixed, and varying the flow rate of the hydrogen gas. As the flow rate of the hydrogen gas is increased to decrease the concentration of the HCl gas in the gas-phase etchant, the etch rate increases to a maximum, marked with an "X" in FIG. 6, and then falls as the flow rate of the hydrogen gas is further increased. The hydrogen flow rate corresponding to the maximum etch rate is the optimum hydrogen flow rate.

Increasing the temperature and/or and increasing the HCl flow rate (i.e., increasing the HCl gas concentration) increases the maximum etch rate. In other words, increasing temperature moves the optimum hydrogen flow rate to the left in FIG. 6. Observations showed that, at temperatures above 800° C., the etch rate increases monotonically with increasing HCl concentration.

The gas-phase etching method according to the present invention as described above provides an etched surface with excellent surface quality and enable regrowth to be performed on the etched surface without additional treatment of the etched surface.

Moreover, unlike plasma etching, the gas-phase etching method according to the invention provides a rapid etch rate without damaging the crystal structure. Further, since plasma irradiation is not used in the present invention, etching and regrowth can be performed in the same reactor. Therefore, the gas-phase etching method according to the invention prevents such problems as the formation of an oxide film or carbon film that obstructs regrowth on the etched surface, or contamination of the regrowth interface with impurities. Semiconductor devices, such as light-emitting diodes or semiconductor lasers that emit ultraviolet to green light, light detectors, transistors for use at high temperature, and other semiconductor elements that are made using crystals etched by the gas-phase etching method according to the invention have high performance and can have significantly extended lifetimes.

In addition, the gas-phase etching method according to the present invention provides a decrease in manufacturing costs and an increase in yield in mass production.

Although this disclosure describes illustrative embodiments of the invention in detail, it is to be understood that the invention is not limited to the precise embodiments described, and that various modifications may be practiced within the scope of the invention defined by the appended claims.

We claim:

1. A method for gas-phase etching a Group III-nitride crystal, the method comprising steps of:
   providing a gas-phase etchant including at least one of a halogen in gaseous form and a hydrogen halide in gaseous form;
   heating the Group III-nitride crystal to a temperature in the range of 500°–900° C.; and
   etching the Group III-nitride crystal in a flow of the gas-phase etchant.

2. The method of claim 1, wherein:
   in the step of providing the gas-phase etchant, the gas-phase etchant is diluted with inert gas; and
   in the step of etching the Group III-nitride crystal, the Group III-nitride is etched in a flow of the gas-phase etchant diluted with the inert gas.

3. The method of claim 2, wherein the step of etching the Group III-nitride crystal includes a step of setting the flow to a pressure substantially equal to atmospheric pressure.

4. The method of claim 1, wherein, in the step of providing the gas-phase etchant, the gas-phase etchant additionally includes hydrogen.

5. The method of claim 4, wherein:
   in the step of providing the gas-phase etchant, the gas-phase etchant is diluted with inert gas; and
   in the step of etching the Group III-nitride crystal, the Group III-nitride is etched in a flow of the gas-phase etchant diluted with the inert gas.

6. The method of claim 5, wherein the step of etching the Group III-nitride crystal includes a step of setting the flow to a pressure substantially equal to atmospheric pressure.

7. The method of claim 4, wherein, in the step of providing a gas-phase etchant, a gas-phase etchant including hydrogen and HCl is provided.

8. The method of claim 4, wherein:
   the step of etching the Group III-nitride crystal forms an etched surface in the Group III-nitride crystal; and
   the method additionally comprises a step of re-growing additional Group III-nitride crystal on the etched surface.

9. The method of claim 4, wherein the step of etching the Group III-nitride crystal includes a step of setting the flow to a pressure substantially equal to atmospheric pressure.

10. The method of claim 1, wherein the method is for etching a Group III-nitride crystal selected from the group consisting of GaN, AlN, InN, GaInN, AlInN, AlGaN, AlGaInN, and BAlGaInN.

11. The method of claim 1, wherein, in the step of providing a gas-phase etchant, a gas-phase etchant including HCl is provided.

12. The method of claim 1, wherein:
   the step of etching the Group III-nitride crystal forms an etched surface in the Group III-nitride crystal; and
   the method additionally comprises a step of re-growing additional Group III-nitride crystal on the etched surface.

13. The method of claim 12, wherein:
   the method additionally comprises a step of providing a reactor;
   the steps of heating the Group III-nitride crystal and etching the Group III-nitride crystal are performed inside the reactor; and
   the step of re-growing additional Group III-nitride crystal is additionally performed inside the reactor without removing the Group III-nitride crystal from the reactor after the etched surface is formed.

14. The method of claim 12, wherein the step of etching the Group III-nitride crystal includes a step of setting the flow to a pressure substantially equal to atmospheric pressure.

15. A method for gas-phase etching a Group III-nitride crystal, the method comprising steps of:
   providing a gas-phase etchant including a mixture of hydrogen and at least one of a halogen in gaseous form and a hydrogen halide in gaseous form;
   heating the Group III-nitride crystal to a temperature in the range of 500°–900° C.; and
   etching the Group III-nitride crystal in a flow of the gas-phase etchant at a pressure substantially equal to atmospheric pressure.

16. The method of claim 15, wherein:
   the step of etching the Group III-nitride crystal forms an etched surface in the Group III-nitride crystal; and
   the method additionally comprises a step of re-growing additional Group III-nitride crystal on the etched surface.

17. The method of claim 15, wherein:
   in the step of providing the gas-phase etchant, the gas-phase etchant is diluted with inert gas; and
   in the step of etching the Group III-nitride crystal, the Group III-nitride is etched in a flow of the gas-phase etchant diluted with the inert gas.

* * * * *